Jan. 20, 1970 E. M. WILLER 3,490,603

COLLAPSIBLE, CONTINUOUSLY ADJUSTABLE PRINTED CIRCUIT BOARD RETAINING DEVICE

Filed June 28, 1967

INVENTOR
ERNEST M. WILLER

BY Nathan Cass
HIS ATTORNEY

United States Patent Office 3,490,603
Patented Jan. 20, 1970

3,490,603
COLLAPSIBLE, CONTINUOUSLY ADJUSTABLE PRINTED CIRCUIT BOARD RETAINING DEVICE

Ernest M. Willer, 5241 Loyola Ave., Westminster, Calif. 92683

Filed June 28, 1967, Ser. No. 649,647
Int. Cl. A47g *19/08*
U.S. Cl. 211—41 7 Claims

ABSTRACT OF THE DISCLOSURE

A collapsible, continuously adjustable printed circuit board retaining device having a plurality of lockable scissors linkage mechanisms cooperatively coupling parallel, spaced apart, grooved end members so as to permit rapid and convenient adjustment of the device to accommodate a wide variety of sizes of printed circuit boards, while also permitting the device to be collapsible to small dimensions for economical out-of-use storage.

The use of printed circuit boards in a wide variety of devices and apparatus is increasing at an enormous rate, and a significant portion of production time and expense is often devoted to providing for the handling of these printed circuit boards as they are being operated on and assembled during the production process. These printed circuit boards may contain discrete and/or integrated circuit components, may be of a wide variety of sizes, and may be subject to a wide variety of operations.

Accordingly, it is usually necessary for a production set-up to provide a relatively large number of retaining devices for accommodating the different sizes of printed circuit boards, and the number required must be constantly increased or the devices modified to handle different sizes as required. This not only presents a cost and storage problem, but considerable time may be involved in the change-over each time a different size printed circuit board has to be handled by a production line. While various adjustable types of retaining devices have been devised to reduce these problems, for the most part, such devices have been inadequate in one or more respects, such as being too expensive, too slow, or too difficult to adjust or lock in place, being unable to hold enough boards or lacking adequate mechanical strength or reliability, or requiring excessive storage space, or providing a limited or non-continuous range of adjustment, or providing inadequate access to the printed circuit boards retained thereby.

Accordingly, a broad object of the present invention is to provide an improved adjustable printed circuit board retaining device.

Another object of the present invention is to provide an adjustable printed circuit board retaining device which is capable of an adjustable range of four to one or greater, and which is collapsible down to small dimensions so as to permit economical out-of-use storage.

A further object of the present invention in accordance with one or more of the foregoing objects is to provide an adjustable printed circuit board retaining device which remains rigid and accurate over a wide adjustment range.

Still another object of the invention in accordance with one or more of the foregoing objects is to provide a printed circuit board retaining device having a wide adjustment range and which can rapidly and conveniently be adjusted and locked in any desired position.

A still further object of the present invention in accordance with one or more of the foregoing objects is to provide an adjustable printed circuit board retaining device which will permit ready access to printed circuit boards held thereby.

Yet another object of the invention in accordance with one or more of the foregoing objects is to provide a printed circuit board retaining device which will ruggedly and reliably retain printed circuit boards therein and may also be used as a permanent part of the final structure.

The above objects and features are accomplished in a typical embodiment of the invention by the provision of a collapsible continuously adjustable printed circuit board retaining device having a plurality of scissors linkage mechanisms constructed and arranged in cooperation with printed circuit board holding means so as to provide a rugged mechanical structure for the device, while permitting rapid and convenient adjustment and locking thereof in order to accommodate a wide range or printed circuit board sizes, such as, for example, a range of four to one or greater.

The specific nature of the invention as well as other objects, advantages and uses thereof will become apparent from the following detailed description of a typical embodiment of the invention illustrated in the accompanying drawings in which.

Like numerals designate like elements throughout the figures of the drawings.

Figures 1, 2, 3:
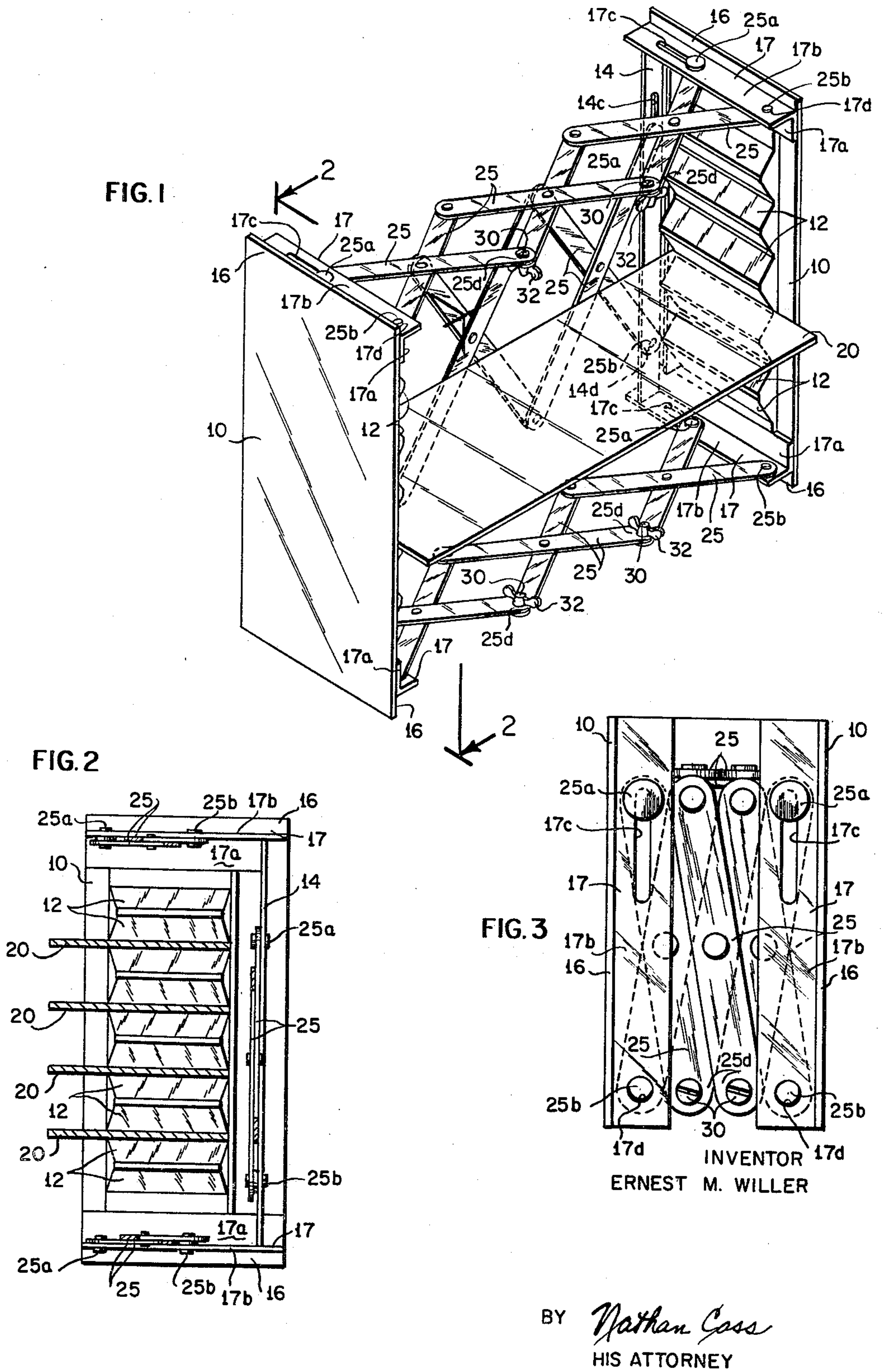
FIG. 1 is a perspective view of a printed circuit board retaining device in accordance with the invention, a typical printed circuit board being shown as retained thereby by way of example.
FIG. 2 is a cross-sectional view of the printed circuit retaining device of FIG. 1 taken along the lines 2—2 and illustrating additional printed circuit boards being retained by the device.
FIG. 3 is a top view of the printed circuit retaining device of FIG. 1 showing the device in its collapsed state without printed circuit boards.

Referring to FIGS. 1–3, a typical embodiment of a printed circuit board retaining device in accordance with the invention will be seen to comprise two parallel rigid end members 10 mechanically coupled together by three scissors linkage mechanisms 25 which cooperate to permit a continuously adjustable spacing between members 10, while maintaining the rigidity of the overall structure for all spacings. Members 10 are provided with mutually opposed grooved or ridged dividers 12 for rigidly retaining printed circuit boards 20 by their edges. The grooved dividers 12 are tapered to permit accommodation of printed circuit boards of varying thicknesses.

The vertical spacings of the printed circuit boards 20 (as viewed in FIGS. 1 and 2) are determined by the spacings of the grooved dividers 12 on each member 10, which are chosen to permit the printed circuit board access desired. The printed circuit boards 20 are accurately positioned horizontally by abutting one end thereof against a stop bar 14 provided depending perpendicularly from one side of said end members 10. The stop bars 14 also serve to prevent a printed circuit board from slipping through the device during handling.

Considering scissor linkage mechanisms 25 in more detail, will be seen that two scissors linkage mechanisms 25 are horizontally disposed (as viewed in FIG. 1) parallel to one another at the top and bottom of the printed circuit board retaining device, while the third scissors linkage mechanism 25 is disposed perpendicular thereto (vertically as viewed in FIG. 1) on the same side of the retaining device as stop bars 14, so as not to interfere with the insertion or removal of printed circuit boards. The use of three scissors linkage mechanisms 25 as shown is highly advantageous in obtaining a rugged and rigid structure for all adjustable positions of the printed circuit board retaining device.

As best seen in FIG. 1, the two parallel horizontally disposed scissors linkage mechanisms 25 are respectively coupled to the top and bottom of end members 10 by means of respective 90° angle bars 17 provided thereon. Each 90° angle bar 17 has one side 17*a* rigidly connected to member 10 and the other side 17*b* providing a slot 17*c* for slidably receiving a respective scissors linkage end pin 25*a*, and a bore 17*d* for pivotably receiving a respective scissors linkage end pin 25*b*.

Respective scissors linkage end pins 25*a* and 25*b* of the vertical scissors linkage mechanism 25 (as viewed in FIG. 1) are similarly coupled to members 10 using slots 14*c* and bores 14*d* provided in respective stop bars 14, whereby all three scissors linkage mechanisms 25 are able to move in unison to permit a continuously adjustable spacing to be provided between members 10, with the grooved dividers 12 remaining parallel at all spacings. The range of adjustment is determined by the length and width of the individual links of the scissors linkage mechanisms 25 and the total number of links provided, and may readily be chosen to provide an adjustment range of four to one or greater.

The printed circuit board retaining device may be locked in any desired position by locking any part of the linkages at either end. Preferably, screws 30 are provided passing through selected linkage pivot holes 25*d* with respective wing nuts 32 being provided on the other side to permit convenient manual locking and unlocking at any desired position. As best seen in FIG. 1, end members 10 have portions 16 extending sufficiently beyond the scissors linkage mechanisms 25 and stop bars 14 to permit the device to be stood on end with the printed circuit boards 20 either horizontal or vertical.

A particularly advantageous feature of the printed circuit board retaining device of the present invention is its capability of being fully collapsible, as illustrated in FIG. 3, so that the space required for not-in-use storage is significantly reduced. Furthermore, the total number of such printed circuit retaining devices required by a production operation is minimized, since the same device can be used for a wide variety of sizes of printed circuit boards.

The printed circuit retaining device of the present invention is, thus, particularly useful for production operations involving short and/or intermittent production runs of different size printed circuit boards. One typical use of the printed circuit board retaining device of the present invention is to retain a number of circuit boards spaced apart and in a horizontal plane after components have been installed in the top sides of the boards prior to dip or wave soldering. Also, by constructing members 10, the scissors linkage mechanisms 25, and the other parts of the device of appropriate materials, the device may be used to retain printed circuit boards during chemical treatment or cleaning operations. Still further, if desired, the retaining device may also be used as a permanent part of the final structure, such as by potting the device and boards in epoxy resin.

While the embodiment shown and described herein is admirably adapted to fulfill the objects and features disclosed, it is to be understood that the present invention is not limited to the specific construction and arrangement shown, and that various modifications in construction, arrangement and use are possible without departing from the spirit of the invention.

What is claimed is:

1. A printed circuit board retaining device comprising: first and second parallel spaced-apart rigid end members, each end member having spaced parallel divider grooves therein, a plurality of adjustable linkage mechanisms, means coupling said end members to said adjustable linkage mechanisms so that adjustment thereof permits continuous variation in the spacing between said end members from minimum to maximum positions while maintaining the divider grooves in said end members mutually opposed and parallel at all spaced positions thereof, each linkage mechanism being collapsible as well as adjustable and being coupled to said end members so that the overall length of said device changes in correspondence with changes in the spacing between said end members, and locking means cooperating with at least one of said adjustable linkage mechanisms for locking thereof at any desired predetermined position between said minimum and maximum positions.

2. The invention in accordance with claim 1, wherein said plurality of adjustable linkage mechanisms includes at least three of which two are disposed parallel and the third is disposed perpendicularly thereto.

3. The invention in accordance with claim 2, wherein each adjustable linkage mechanism is movable between fully collapsed and fully open positions, wherein each adjustable linkage mechanism has one end coupled to one end member and the other end coupled to the other end member, and wherein a stop bar is provided depending from at least one end member and constructed and arranged to stop printed circuit boards inserted in said grooved dividers at a predetermined position.

4. The invention in accordance with claim 3, wherein the divider grooves provided in said end members are tapered to permit receiving printed circuit board edges of varying thicknesses.

5. The invention in accordance with claim 3, wherein said end members are of generally rectangular shape, wherein said means coupling said end members to said adjustable linkage mechanisms includes a perpendicular inwardly depending portion provided at opposite ends of each end member and located so as to be mutually opposed from a like depending portion on the other end member, each inwardly depending portion and each stop member having a slot and a bore therein, and end pins provided at each end of each adjustable linkage mechanism slidably coupled to a respective slot and pivotably coupled to a respective bore as to permit said adjustable linkage mechanisms to move in unison to provide a continuously adjustable spacing between said end members, the two parallel adjustable linkage mechanisms being coupled between respective ones of said inwardly depending portions and the perpendicular adjustable linkage mechanism being coupled between said stop bars.

6. The invention in accordance with claim 3, wherein said linkage mechanisms are of scissors type and include pivotably connected links, wherein said locking means includes a screw passing through a pivot hole in one of said links, and wherein a wing nut is provided on the other side thereof to provide for convenient manual locking or release thereof.

7. The invention in accordance with claim 6, wherein said end members include portions extending sufficiently beyond said adjustable linkage mechanisms and stop bars so as to permit said device to be stood on end in either of two perpendicular positions.

References Cited

UNITED STATES PATENTS

| | | | |
|---|---|---|---|
| 146,110 | 12/1873 | Turner | 248—277 |
| 1,198,450 | 9/1916 | Jones | 211—179 XR |
| 2,599,863 | 6/1952 | Riemvis | 248—172 XR |
| 3,014,594 | 12/1961 | Kerstner | 211—41 |
| 3,245,366 | 4/1966 | Fox | 108—145 |
| 3,271,626 | 9/1966 | Howrilka | 211—41 XR |

ROY D. FRAZIER, Primary Examiner

RAYMOND D. KRAUS, Assistant Examiner

U.S. Cl. X.R.

211—179; 248—172, 277